United States Patent
Karikalan et al.

(10) Patent No.: US 9,013,041 B2
(45) Date of Patent: Apr. 21, 2015

(54) SEMICONDUCTOR PACKAGE WITH ULTRA-THIN INTERPOSER WITHOUT THROUGH-SEMICONDUCTOR VIAS

(75) Inventors: Sampath K. V. Karikalan, Irvine, CA (US); Sam Ziqun Zhao, Irvine, CA (US); Kevin Kunzhong Hu, Irvine, CA (US); Rezaur Rahman Khan, Rancho Santa Margarita, CA (US); Pieter Vorenkamp, Laguna Niguel, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 14 days.

(21) Appl. No.: 13/339,234

(22) Filed: Dec. 28, 2011

(65) Prior Publication Data

US 2013/0168860 A1 Jul. 4, 2013

(51) Int. Cl.
| | | |
|---|---|---|
| *H01L 23/538* | (2006.01) | |
| *H01L 23/48* | (2006.01) | |
| *H01L 23/498* | (2006.01) | |
| *H01L 23/522* | (2006.01) | |
| *H01L 25/065* | (2006.01) | |
| *H01L 23/31* | (2006.01) | |

(52) U.S. Cl.
CPC .............. *H01L 23/538* (2013.01); *H01L 23/48* (2013.01); *H01L 23/49816* (2013.01); *H01L 23/49827* (2013.01); *H01L 23/5223* (2013.01); *H01L 2224/16225* (2013.01); *H01L 2924/15192* (2013.01); *H01L 2924/15311* (2013.01); *H01L 25/0655* (2013.01); *H01L 23/3128* (2013.01)

(58) Field of Classification Search
CPC ............................ H01L 23/532; H01L 23/538
See application file for complete search history.

(56) References Cited

U.S. PATENT DOCUMENTS

| | | | |
|---|---|---|---|
| 7,619,441 B1* | 11/2009 | Rahman et al. | 326/38 |
| 2004/0124511 A1 | 7/2004 | Li | |
| 2004/0178484 A1* | 9/2004 | Burdick et al. | 257/678 |
| 2005/0281008 A1* | 12/2005 | He et al. | 361/748 |
| 2008/0265399 A1* | 10/2008 | Chao | 257/698 |
| 2008/0285244 A1* | 11/2008 | Knickerbocker | 361/760 |
| 2011/0186977 A1 | 8/2011 | Chi et al. | |
| 2013/0020675 A1* | 1/2013 | Kireev et al. | 257/531 |

FOREIGN PATENT DOCUMENTS

| | | |
|---|---|---|
| CN | 1541414 A | 10/2004 |
| CN | 101345199 A | 1/2009 |
| CN | 102194740 A | 9/2011 |
| CN | 203103294 U | 7/2013 |
| JP | 2003-163310 A | 6/2003 |
| TW | 201140792 | 11/2011 |

(Continued)

*Primary Examiner* — Matthew Reames
(74) *Attorney, Agent, or Firm* — McDermott Will & Emery LLP

(57) ABSTRACT

There are disclosed herein various implementations of semiconductor packages including an interposer without through-semiconductor vias (TSVs). One exemplary implementation includes a first active die situated over an interposer. The interposer includes an interposer dielectric having intra-interposer routing traces. The first active die communicates electrical signals to a package substrate situated below the interposer utilizing the intra-interposer routing traces and without utilizing TSVs. In one implementation, the semiconductor package includes a second active die situated over the interposer, the second active die communicating electrical signals to the package substrate utilizing the intra-interposer routing traces and without utilizing TSVs. Moreover, in one implementation, the first active die and the second active die communicate chip-to-chip signals through the interposer.

18 Claims, 3 Drawing Sheets

SEMICONDUCTOR PACKAGE WITH ULTRA-THIN INTERPOSER WITHOUT THROUGH-SEMICONDUCTOR VIAS

BACKGROUND

Many widely used consumer electronic devices, such as mobile communication devices, for example, rely on integrated circuits (ICs) for their operation. As those electronic devices become ever more sophisticated while often concurrently being reduced in size, IC density and packaging become increasingly important design constraints. In response, more advanced packaging solutions have been developed. One such packaging solution uses one or more interposers to facilitate interconnection of multiple active semiconductor dies within a single package.

A conventional interposer typically includes an interposer dielectric formed over a relatively thick semiconductor substrate. Through-semiconductor vias (TSVs) are often utilized to provide electrical connections between the active semiconductor dies, which may be situated over the interposer, and a package substrate underlying the interposer. However, leakage through the semiconductor substrate can adversely affect the electrical signals passing through the TSVs.

SUMMARY

The present disclosure is directed to a semiconductor package with ultra-thin interposer without through-semiconductor vias, substantially as shown in and/or described in connection with at least one of the figures, and as set forth more completely in the claims.

DETAILED DESCRIPTION

Figure 1:
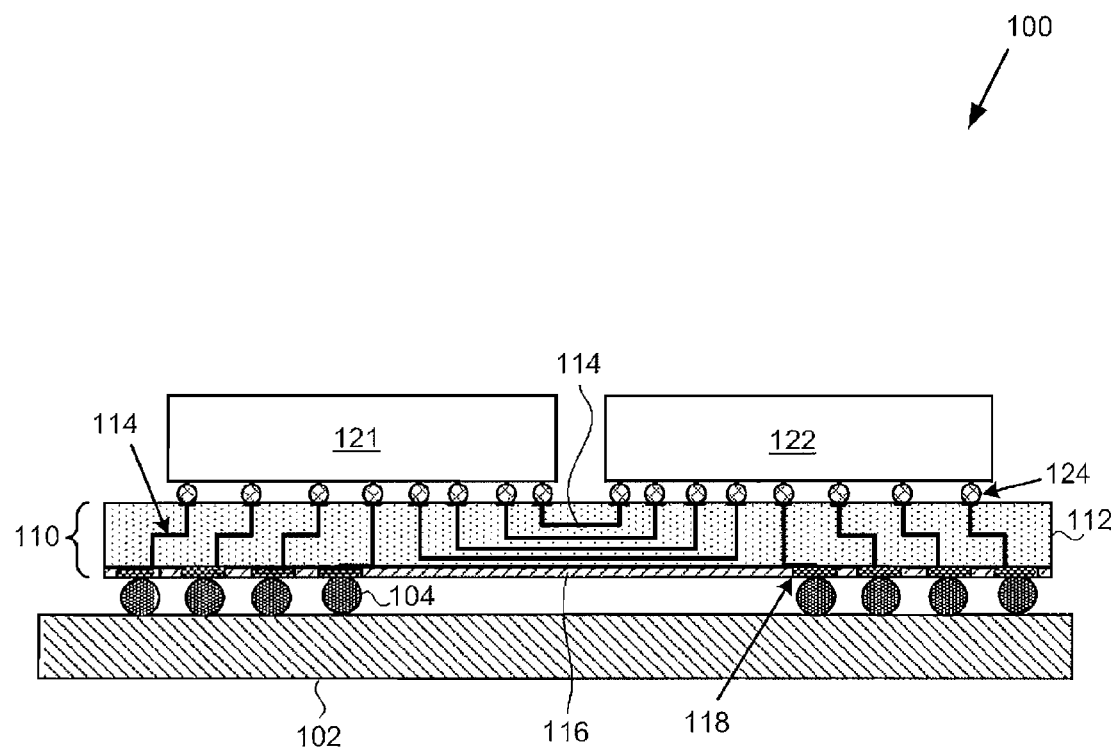
FIG. 1 shows a cross-sectional view of one implementation of a semiconductor package including an ultra-thin interposer without through-semiconductor vias (TSVs).

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of one implementation of a semiconductor package including an ultra-thin interposer without through-semiconductor vias (TSVs). As shown in FIG. 1, semiconductor package 100 includes first active die 121, second active die 122, interposer 110, and package substrate 102. As further shown in FIG. 1, interposer 110 includes interposer dielectric 112 having intra-interposer routing traces 114 formed therein, passivation layer 116, and under-bump metallizations (UBMs) 118 formed in passivation layer 116 so as to contact intra-interposer routing traces 114. Also shown in FIG. 1 are solder balls 104 electrically connecting interposer 110 to package substrate 102, and micro-bumps 124 electrically connecting first active die 121 and second active die 122 to interposer 110.

It is noted that although only two exemplary intra-interposer routing traces are specifically designated by reference number 114 in FIG. 1, it is to be understood that any or all of the twelve intra-interposer routing traces shown in interposer dielectric 112 may be characterized as intra-interposer routing trace(s) 114. It is further noted that although only one each of solder balls 104, UBMs 118, and micro-bumps 124 are specifically designated by reference numbers in FIG. 1, any or all of the eight solder balls, eight UBMs, and sixteen micro-bumps shown in FIG. 1 may be characterized as solder ball(s) 104, UBM(s) 118, and micro-bump(s) 124, respectively.

First active die 121 and second active die 122 may be packaged or unpackaged dies, for example. Although first active die 121 and second active die 122 are shown in flip chip configuration, in FIG. 1, that representation is merely exemplary, and in other implementations, one or both of first active die 121 and second active die 122 may exhibit a different configuration. Moreover, it is to be understood that although the implementation shown in FIG. 1 depicts two active dies coupled to package substrate 102 through interposer 110, e.g., first active die 121 and second active die 122, in one implementation, a single active die, such as active die 121, may be coupled to package substrate 102 through interposer 110. In other implementations, however, more than two active dies may be coupled to package substrate 102 through interposer 110.

As shown by FIG. 1, in semiconductor package 100, first active die 121 is situated over interposer 110 and is configured to communicate electrical signals to package substrate 102 situated below interposer 110 utilizing intra-interposer routing traces 114, and without utilizing TSVs, which are entirely absent from interposer 110. In other words, first active die 121 communicates electrical signals to package substrate 102 through interposer 110 having no TSVs, using micro-bumps 124, intra-interposer routing traces 114, UBMs 118, and solder balls 104.

Semiconductor package 100 also includes second active die 122 situated over interposer 110 and configured to communicate electrical signals to package substrate 102 situated below interposer 110 utilizing intra-interposer routing traces 114, and without utilizing TSVs. That is to say, like first active die 121, second active die 122 is configured to communicate electrical signals to package substrate 102 through interposer 110 using micro-bumps 124, intra-interposer routing traces 114, UBMs 118, and solder balls 104. Moreover, and as further shown in FIG. 1, according to the present implementation, semiconductor package 100 is configured to enable first active die 121 and second active die 122 to communicate chip-to-chip signals through interposer 110, for example, by using micro-humps 124 and intra-interposer routing traces 114 in interposer dielectric 112.

Interposer dielectric 112 may be formed of a rigid dielectric material, such as fiber reinforced bismaleimide triazine (BT), FR-4, glass, or ceramic, for example. Alternatively, interposer dielectric 112 may be a flexible dielectric formed of a polyimide film or other suitable tape material. In some implementations interposer dielectric 112 may be formed of an epoxy-phenolic or cyanate ester-epoxy build-up material. As a specific example, in one implementation, interposer dielectric 112 may be formed of an Ajinomoto™ Build-up Film (ABF). According to that exemplary implementation, intra-interposer routing traces 114 can be formed during a build-up process for forming interposer dielectric 112, using any suitable technique known in the art.

As noted above, according to the present implementation, interposer 110 includes passivation layer 116. Passivation layer 116 may be an oxide or nitride layer, such as a silicon nitride ($Si_3N_4$) layer, for example, formed using a chemical vapor deposition process (CVD), or any other suitable process for producing passivation layer 116. It is noted that in some implementations passivation layer 116 may be omitted. UBMs 118 provide electrical connectivity between intra-interposer routing traces 114 and solder balls 104. UBMs 118 may be formed from a metal, metal alloy, multi-metal or multi-alloy stack, such as a multi-alloy stack including a combination of copper (Cu), nickel (Ni), titanium (Ti), tungsten (W), vanadium (V), chromium (Cr), and gold (Au), for example. UBMs 118 may be formed using an electrochemical deposition processes, for example, or any other suitable technique, as known in the art.

According to the implementation shown in FIG. 1, first active die 121 and second active die 122 are electrically connected to interposer 110 by micro-bumps 124. It is noted, however, that more generally, micro-bumps 124 may correspond to any electrical contact body suitable for coupling second active die 122 and/or first active die 121 to interposer 110. Thus, in other implementations, micro-bumps 124 may be replaced by respective conductive posts or pillars, for example, metal posts or pillars formed of copper. Moreover, in other implementations, solder balls 104 may correspond to any conductive bodies suitable for forming stable electrical connections between UBMs 118 of interposer 110 and package substrate 102.

In contrast to conventional semiconductor packages, in which an interposer typically includes an interposer dielectric layer and an interposer semiconductor substrate, semiconductor package 100 is implemented using interposer 110, from which an interposer semiconductor substrate has been eliminated. In addition, and in further contrast to conventional packaging solutions utilizing TSVs to provide electrical connections between an active die situated over an interposer and a package substrate underlying the interposer, semiconductor package 100 includes interposer 110 having no TSVs. As a result, semiconductor package 100 advantageously avoids the semiconductor leakage and electrical coupling amongst TSVs that are known to adversely affect signals passing through TSVs in the conventional art. Moreover, semiconductor package 100 advantageously achieves a very small (ultra-thin) form factor.

Figure 2:
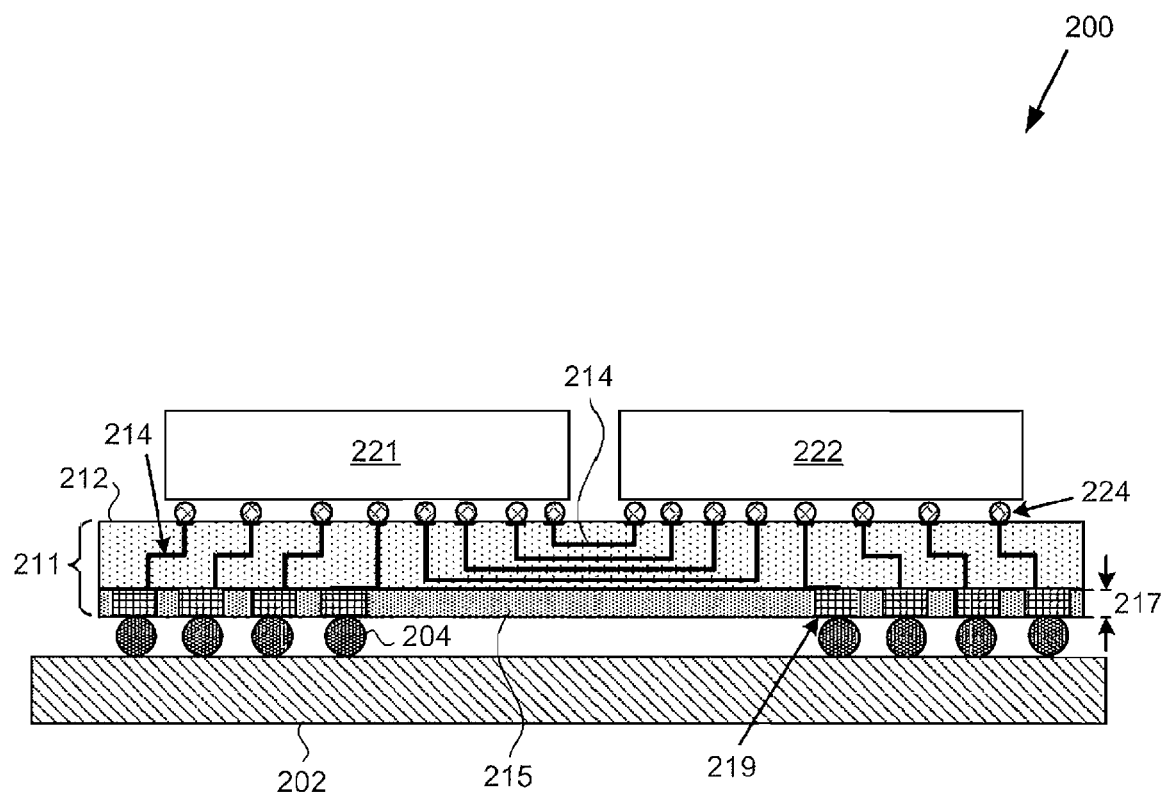
FIG. 2 shows a cross-sectional view of another implementation of a semiconductor package including an ultra-thin interposer without TSVs.

Turning now to FIG. 2, FIG. 2 shows a cross-sectional view of another implementation of a semiconductor package including an ultra-thin interposer without TSVs. As shown in FIG. 2, semiconductor package 200 includes first active die 221, second active die 222, interposer 211, and package substrate 202. As further shown in FIG. 2, interposer 211 includes interposer dielectric 212 having intra-interposer routing traces 214, interposer semiconductor 215 having thickness 217, and connection pads 219 formed in interposer semiconductor 215 so as to contact intra-interposer routing traces 214. Also shown in FIG. 2 are solder balls 204 electrically connecting interposer 211 to package substrate 202, and micro-bumps 224 electrically connecting first active die 221 and second active die 222 to interposer 211.

First active die 221, second active die 222, micro-bumps 224, solder balls 204, and package substrate 202 correspond respectively to first active die 121, second active die 122, micro-bumps 124, solder balls 104, and package substrate 102, in FIG. 1, and may share the characteristics attributed to those corresponding features above. In addition, interposer dielectric 212 and intra-interposer routing traces 214, in FIG. 2, correspond respectively to interposer dielectric 112 and intra-interposer routing traces 114, in FIG. 1, and may also share the characteristics previously attributed to those corresponding features. For example, like interposer dielectric 112, in one implementation, interposer dielectric 212, in FIG. 2, may be formed of ABF™.

It is noted that although only one of connection pads 219 is specifically designated by a reference number in FIG. 2, any or all of the eight connection pads shown in FIG. 2 to extend through interposer semiconductor 215 so as to contact intra-interposer routing traces 214 may be characterized as connection pad(s) 219. In addition, it is reiterated that although first active die 221 and second active die 222 are shown in flip chip configuration, that representation is merely exemplary, and in other implementations, one or both of first active die 221 and second active die 222 may exhibit a different configuration. Moreover, it is to be understood that although the implementation shown in FIG. 2 depicts two active dies coupled to package substrate 202 through interposer 211, e.g., first active die 221 and second active die 222, in one implementation, a single active die, such as active die 221, may be coupled to package substrate 202 through interposer 211. As is also true of the representation shown in FIG. 1, however, in other implementations of semiconductor package 200, in FIG. 2, more than two active dies may be coupled to package substrate 202 through interposer 211.

According to the implementation shown in FIG. 2, first active die 221 is situated over interposer 211. As further shown in FIG. 2, interposer 211 includes interposer dielectric 212 having intra-interposer routing traces 214 formed therein, and interposer semiconductor 215 below interposer dielectric 212. First active die 221 is configured to communicate electrical signals to package substrate 202 situated below interposer 211 utilizing intra-interposer routing traces 214 and connection pads 219, without utilizing TSVs, which are omitted from interposer 211. That is to say, first active die 221 communicates electrical signals to package substrate 202 through interposer 211 having no TSVs, using micro-bumps 224, intra-interposer routing traces 214, connection pads 219, and solder balls 204.

As shown in FIG. 2, semiconductor package 200 also includes second active die 222 situated over interposer 211 and configured to communicate electrical signals to package substrate 202 situated below interposer 211 utilizing intra-interposer routing traces 214 and connection pads 219, without utilizing TSVs. That is to say, like first active die 221, second active die 222 is configured to communicate electrical signals to package substrate 202 through interposer 211 using micro-bumps 224, intra-interposer routing traces 214, connection pads 219, and solder balls 204. Moreover, and as further shown in FIG. 2, according to the present implementation, semiconductor package 200 is configured to enable first active die 221 and second active die 222 to communicate chip-to-chip signals through interposer 211.

As noted above, according to the present implementation, interposer 211 includes interposer semiconductor 215 having thickness 217, through which connection pads 219 extend. Interposer semiconductor 215 may be a Group IV semiconductor, such as silicon, for example. However, and in contrast to conventional interposers including a semiconductor substrate through which TSVs are typically formed, interposer semiconductor 215 may have a substantially reduced thickness 217. For example, rather than a thickness of approximately 100 microns (100 μm), or more, which is a typical semiconductor substrate thickness in conventional interposer implementations, reduced thickness 217 may be approximately twenty microns (20 μm), or less. In one implementation, for example, interposer semiconductor 215 may have thickness 217 in a range from approximately five microns to approximately twenty microns (5-20 μm).

Connection pads 219 may be formed of a conductive metal such as copper. For example, connection pads 219 may be realized through interposer semiconductor 215 by first etching or drilling cavities into a semiconductor wafer, filling the cavities with copper through a plating process, and backgrinding the semiconductor to expose connection pads 219. Unlike TSVs, which typically include a dielectric barrier layer and a conductive via fill material, connection pads 219 may be formed so as to extend through interposer semiconductor 215 without the presence of an intervening dielectric layer to isolate connection pads 219 from interposer semiconductor 215. Moreover, due to reduced thickness 217 of interposer semiconductor 215, semiconductor package 200 advantageously avoids, or substantially reduces, the semiconductor leakage and electrical coupling amongst TSVs that are known to adversely affect signals passing through TSVs in the conventional art.

Figure 3:
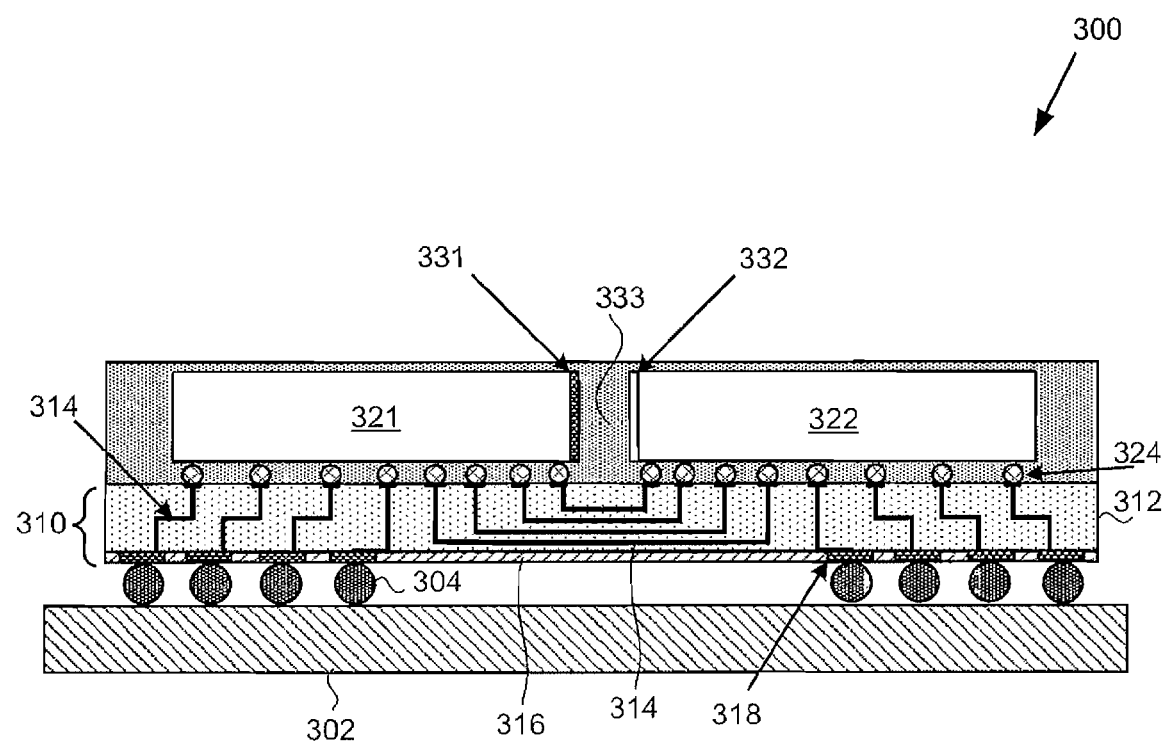
FIG. 3 shows a cross-sectional view of yet another implementation of a semiconductor package including an ultra-thin interposer without TSVs.

Continuing to FIG. 3, FIG. 3 shows a cross-sectional view of yet another implementation of a semiconductor package including an ultra-thin interposer without TSVs. As shown in FIG. 3, semiconductor package 300 includes first active die 321 having sidewall 331, second active die 322 having sidewall 332, filler material 333 between respective sidewalls 331 and 332 of first active die 321 and second active die 322, interposer 310, and package substrate 302. As will be further described below, filler material 333 may be a dielectric filler material providing capacitive coupling between sidewalls 332 and 333.

As further shown in FIG. 3, interposer 310 includes interposer dielectric 312 having intra-interposer routing traces 314, passivation layer 316, and UBMs 318 formed in passivation layer 316 so as to contact intra-interposer routing traces 314. Also shown in FIG. 3 are solder balls 304 electrically connecting interposer 310 to package substrate 302, and micro-bumps 324 electrically connecting first active die 321 and second active die 322 to interposer 310.

First active die 321, second active die 322, micro-bumps 324, solder balls 304, and package substrate 302 correspond respectively to first active die 121, second active die 122, micro-bumps 124, solder balls 104, and package substrate 102, in FIG. 1, and may share the characteristics attributed to those corresponding features above. In addition, interposer 310 including interposer dielectric 312, intra-interposer routing traces 314, passivation layer 316, and UBMs 318, in FIG. 3, corresponds to interposer 110 including interposer dielectric 112, intra-interposer routing traces 114, passivation layer 116, and UBMs 118, in FIG. 1, and may also share the characteristics previously attributed to those corresponding features. For example, like interposer dielectric 112, in one implementation, interposer dielectric 312, in FIG. 3, may be formed of ABF™.

As shown in FIG. 3, first active die 321 and second active die 322 are situated over interposer 310. As further shown in FIG. 3, interposer 310 includes interposer dielectric 312 having intra-interposer routing traces 314 formed therein. First active die 321 includes sidewall 331, which may be formed as a capacitive connection pad, for example. Similarly, second active die 322 includes sidewall 332, which may also be formed as a capacitive connection pad. According to the implementation of FIG. 3, first active die 321 is configured to communicate AC signals (alternating-current signals) to second active die 322 through filler material 333. For example, according to one implementation, sidewall 331 of first active die 321 may serve as a first capacitor plate and sidewall 333 of second active die 322 may serve as a second capacitor plate, with filler material 333 selected to serve as a capacitor dielectric for mediating AC coupling between respective sidewalls 331 and 332.

In addition to the AC coupling of first active die 321 and second active die 322 through filler material 333 described above, first active die 321 and second active die 322 are further configured to communicate electrical signals to package substrate 302, situated below interposer 310, utilizing intra-interposer routing traces 314, without utilizing TSVs. It is noted that in an alternative implementation, the arrangement shown in FIG. 3 may be modified through substitution of interposer 211, in FIG. 2, for interposer 310. In that implementation, in addition to the AC coupling of first active die 321 and second active die 322 through filler material 333, first active die 321 and second active die 322 are further configured to communicate electrical signals to package substrate 302 utilizing intra-interposer routing traces corresponding to intra-interposer routing traces 214, and connection pads corresponding to connection pads 219, without utilizing TSVs. That is to say, first active die 321 and second active die 322 can communicate electrical signals to package substrate 302 through an interposer corresponding to interposer 211, which includes an interposer semiconductor having no TSVs.

Thus, by using an interposer having a reduced or eliminated interposer semiconductor, various implementations of the concepts disclosed herein advantageously enable the substantial reduction or elimination of leakage through the interposer. In addition, the described implementations advantageously disclose use of an interposer having no TSVs. Consequently, the concepts and implementations disclosed herein enable avoidance of the adverse impacts on signals passing through conventional interposers including TSVs. Moreover, very small (ultra-thin) form factors are achieved by various implementations disclosed herein.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
an interposer substantially consisting of a dielectric material including first routing traces and second routing traces, the first routing traces and the second routing traces consisting of one or more conductive materials, the first routing traces disposed in a fan-out arrangement, the second routing traces disposed in an interconnecting arrangement;
a package substrate coupled to a first surface of the interposer;
a first active die coupled to a second surface of the interposer, said first active die configured to communicate electrical signals to the package substrate through the first routing traces; and a second active die coupled to the second surface of the interposer, the second active die configured to communicate chip-to-chip signals with the first active die through the second routing traces.

2. The semiconductor package of claim 1, wherein the second active die is configured to communicate electrical signals to said package substrate through the first routing traces.

3. The semiconductor package of claim 1, wherein said interposer includes an interposer semiconductor layer located adjacent to the first surface of the interposer.

4. The semiconductor package of claim 3, wherein said interposer semiconductor layer includes connection pads, and said first active die is configured to communicate the electrical signals to said package substrate through said connection pads.

5. The semiconductor package of claim 4, wherein said second active die is configured to communicate electrical signals to said package substrate through said connection pads.

6. The semiconductor package of claim 1, further comprising a filler material between respective sidewalls of said first active die and said second active die, said first active die configured to send alternating current (AC) signals to said second active die through said filler material.

7. A semiconductor package comprising:
an interposer substantially consisting of a bulk dielectric material including first routing traces and second routing traces, the first routing traces and the second routing traces consisting of one or more conductive materials, the first routing traces disposed in a fan-out arrangement, the second routing traces disposed in an interconnecting arrangement;
a package substrate coupled to a first surface of the interposer;
a first die coupled to a second surface of the interposer said first die configured to communicate signals to the package substrate through the first routing traces; and
a second die coupled to the second surface of the interposer, the second die configured to be electrically coupled to the first die through the second routing traces.

8. The semiconductor package of claim 7, wherein said second die is configured to communicate signals to said package substrate through the first routing traces.

9. The semiconductor package of claim 7, wherein said first die and said second die are configured to communicate chip-to-chip signals through the second routing traces.

10. The semiconductor package of claim 7, wherein said interposer includes an interposer semiconductor layer located adjacent to the first surface of the interposer.

11. The semiconductor package of claim 10, wherein said interposer semiconductor layer includes connection pads, and said first die configured to communicate the signals to said package substrate through said connection pads.

12. The semiconductor package of claim 11, wherein said second die is configured to communicate signals to said package substrate through said connection pads.

13. The semiconductor package of claim 7, further comprising a filler material between respective sidewalls of said first die and said second die.

14. The semiconductor package of claim 13, wherein said first die is configured to send alternating signals (AC) signals to said second die through said filler material.

15. A semiconductor package comprising:
a package substrate;
an interposer substantially consisting of a dielectric material including first routing traces and second routing traces, the first routing traces and the second routing traces consisting of one or more conductive materials, the first routing traces disposed in a fan-out arrangement, the second routing traces disposed in an interconnecting arrangement, the package substrate coupled to a first surface of the interposer;
a first die coupled to a second surface of the interposer; and
a second die coupled to the second surface of the interposer,
wherein:
the first die is configured to communicate signals to the package substrate through the first routing traces, and
the first die is configured to be electrically coupled to the second die through the second routing traces.

16. The semiconductor package of claim 1, wherein the interposer includes a passivation layer comprising metallizations, and wherein:
at least one of the metallizations is in contact with at least one routing trace of the first routing traces, and
each of the first active die and the second active die is configured to communicate electrical signals to the package substrate through the metallizations.

17. The semiconductor package of claim 7, wherein the interposer includes a passivation layer comprising metallizations, and wherein at least one of the metallizations is in contact with at least one routing trace of the first routing traces.

18. The semiconductor package of claim 15, further comprising a filler material disposed adjacent to the second surface of the interposer, wherein the first die and the second die are coupled to each other through the filler material.

* * * * *